(12) United States Patent
Cola et al.

(10) Patent No.: US 10,707,596 B2
(45) Date of Patent: Jul. 7, 2020

(54) COATED ELECTRICAL CONNECTORS AND METHODS OF MAKING AND USING THEREOF

(71) Applicant: Carbice Corporation, Atlanta, GA (US)

(72) Inventors: Baratunde Cola, Atlanta, GA (US); Craig Green, Atlanta, GA (US); A. Davin Oetomo, Atlanta, GA (US)

(73) Assignee: Carbice Corporation, Atlanta, GA (US)

( * ) Notice: Subject to any disclaimer, the term of this patent is extended or adjusted under 35 U.S.C. 154(b) by 0 days.

(21) Appl. No.: 16/138,852

(22) Filed: Sep. 21, 2018

(65) Prior Publication Data

US 2020/0099147 A1    Mar. 26, 2020

(51) Int. Cl.
| | | |
|---|---|---|
| *H01R 11/12* | (2006.01) | |
| *H01R 13/03* | (2006.01) | |
| *H01R 43/16* | (2006.01) | |
| *B01J 23/755* | (2006.01) | |
| *B01J 21/18* | (2006.01) | |
| *H01R 4/18* | (2006.01) | |
| *H05K 7/20* | (2006.01) | |
| *B82Y 30/00* | (2011.01) | |

(52) U.S. Cl.
CPC ............ *H01R 11/12* (2013.01); *B01J 21/185* (2013.01); *B01J 23/755* (2013.01); *H01R 4/18* (2013.01); *H01R 13/03* (2013.01); *H01R 43/16* (2013.01); *B82Y 30/00* (2013.01); *H05K 7/2039* (2013.01)

(58) Field of Classification Search
CPC ......... H01R 11/12; H01R 13/03; B01J 21/185
USPC ........................................ 439/868, 860, 886
See application file for complete search history.

(56) References Cited

U.S. PATENT DOCUMENTS

| | | | |
|---|---|---|---|
| 2,243,979 A | 6/1941 | Reynolds | |
| 5,620,338 A * | 4/1997 | Stephens | H01R 11/281 439/522 |
| 6,250,127 B1 | 6/2001 | Polese | |
| 6,884,833 B2 * | 4/2005 | Chheang | C08K 3/346 524/445 |
| 6,921,462 B2 | 7/2005 | Montgomery | |
| 6,921,575 B2 * | 7/2005 | Horiuchi | B82Y 15/00 428/367 |
| 6,965,513 B2 | 11/2005 | Montgomery | |
| 7,086,451 B2 | 8/2006 | Leu | |
| 7,253,442 B2 * | 8/2007 | Huang | H01L 23/373 257/77 |

(Continued)

FOREIGN PATENT DOCUMENTS

| | | |
|---|---|---|
| EP | 2251302 | 11/2010 |
| JP | 2013115094 | 6/2013 |
| WO | 2013007645 | 1/2013 |

OTHER PUBLICATIONS

Bayer, et al., Support-Catalyst-Gas interactions during carbon nanotube growth on metallic ta films, J Phys. Chem., 115:4359-69 (2011).

(Continued)

*Primary Examiner* — Tulsidas C Patel
*Assistant Examiner* — Peter G Leigh
(74) *Attorney, Agent, or Firm* — Pabst Patent Group LLP (57) ABSTRACT

Electrical connectors coated with one or more coatings formed of carbon nanotube arrays or sheets, as well as methods of making and using thereof are described herein.

51 Claims, 3 Drawing Sheets

(56) References Cited

U.S. PATENT DOCUMENTS

| | | | |
|---|---|---|---|
| 7,465,605 B2 | 12/2008 | Raravikar | |
| 7,507,987 B2* | 3/2009 | Kim | B82Y 10/00 257/10 |
| 7,794,828 B1* | 9/2010 | Momoda | B64G 1/226 428/131 |
| 7,862,342 B2* | 1/2011 | Zhou | B82Y 10/00 439/60 |
| 8,038,479 B2* | 10/2011 | Searfass | B82Y 30/00 439/658 |
| 8,093,715 B2 | 1/2012 | Xu | |
| 8,127,440 B2* | 3/2012 | Douglas | B82Y 10/00 174/254 |
| 8,220,530 B2* | 7/2012 | Cola | B01J 23/745 165/133 |
| 8,499,817 B2* | 8/2013 | Hu | C22C 26/00 164/97 |
| 8,753,924 B2* | 6/2014 | Wainerdi | H01L 24/29 257/675 |
| 8,810,995 B2* | 8/2014 | Zhou | H01B 1/04 361/502 |
| 8,864,927 B2* | 10/2014 | Zheng | B82Y 10/00 156/230 |
| 8,919,428 B2* | 12/2014 | Cola | B01J 23/745 165/185 |
| 8,957,690 B2* | 2/2015 | Kim | G01R 1/06744 324/754.03 |
| 9,087,798 B2* | 7/2015 | Ohtake | H01J 37/32082 |
| 9,385,449 B2* | 7/2016 | Peters | H01R 4/203 |
| 9,443,638 B2* | 9/2016 | Chow | H01B 1/04 |
| 9,559,443 B2* | 1/2017 | Boutin | H01R 11/11 |
| 9,656,246 B2* | 5/2017 | Cola | B01J 23/745 |
| 9,667,015 B2* | 5/2017 | Schmidt | H01R 13/03 |
| 9,793,627 B2* | 10/2017 | Omori | H01R 4/64 |
| 9,920,178 B2* | 3/2018 | Starkovich | C08J 9/35 |
| 9,956,743 B2* | 5/2018 | Jin | B05D 5/08 |
| 9,985,362 B2* | 5/2018 | Arenburg | H01R 4/70 |
| 2002/0140336 A1 | 10/2002 | Stoner | |
| 2003/0100654 A1* | 5/2003 | Chheang | C08K 3/346 524/445 |
| 2004/0065717 A1 | 4/2004 | Saijo | |
| 2004/0105807 A1 | 6/2004 | Fan | |
| 2004/0184981 A1 | 9/2004 | Liu | |
| 2004/0261987 A1 | 12/2004 | Zhang | |
| 2005/0214197 A1 | 9/2005 | Gu | |
| 2005/0228097 A1 | 10/2005 | Zhong | |
| 2006/0068195 A1* | 3/2006 | Majumdar | B32B 37/00 428/323 |
| 2006/0073089 A1 | 4/2006 | Ajayan | |
| 2006/0118791 A1* | 6/2006 | Leu | B82Y 10/00 257/77 |
| 2006/0163622 A1* | 7/2006 | Montgomery | B82Y 10/00 257/264 |
| 2006/0188721 A1* | 8/2006 | Irvin, Jr. | B44C 1/17 428/402 |
| 2006/0231970 A1 | 10/2006 | Huang | |
| 2006/0251897 A1* | 11/2006 | Pan | H01L 23/373 428/408 |
| 2007/0092431 A1* | 4/2007 | Resasco | B01J 23/882 423/447.3 |
| 2007/0116626 A1* | 5/2007 | Pan | H01L 21/4871 423/447.1 |
| 2007/0116957 A1* | 5/2007 | Pan | C23C 14/18 428/408 |
| 2007/0253889 A1 | 11/2007 | Awano | |
| 2008/0095695 A1 | 4/2008 | Shanov | |
| 2008/0149166 A1 | 6/2008 | Beeson | |
| 2008/0160866 A1 | 7/2008 | Zhang | |
| 2008/0236804 A1 | 10/2008 | Cola | |
| 2008/0241755 A1 | 10/2008 | Franklin | |
| 2008/0292840 A1* | 11/2008 | Majumdar | B32B 3/14 428/114 |
| 2009/0032496 A1 | 2/2009 | Yao | |
| 2009/0181239 A1* | 7/2009 | Fan | B29C 43/003 428/327 |
| 2009/0246507 A1 | 10/2009 | Graham | |
| 2010/0027221 A1 | 2/2010 | Iwai | |
| 2011/0020593 A1 | 1/2011 | Winkler | |
| 2011/0086464 A1 | 4/2011 | Kim | |
| 2011/0189500 A1* | 8/2011 | Majumdar | F28F 13/00 428/623 |
| 2012/0000899 A1* | 1/2012 | Eom | F25D 21/04 219/385 |
| 2012/0128880 A1 | 5/2012 | Talapatra | |
| 2012/0202047 A1* | 8/2012 | Welch | B32B 5/16 428/323 |
| 2013/0234313 A1 | 9/2013 | Wainerdi | |
| 2014/0015158 A1 | 1/2014 | Cola | |
| 2014/0227477 A1* | 8/2014 | Cola | H01L 23/3735 428/98 |
| 2016/0294107 A1* | 10/2016 | Trimborn | H01R 4/30 |
| 2018/0254236 A1* | 9/2018 | Cola | H01L 23/3735 |

OTHER PUBLICATIONS

Cola, et al., "Contact mechanics and thermal conductance of carbon nanotube array interfaces", Int. J. Heat Mass Trans., 52:3490-3503 (2009).

Hildreth, et al., "Conformally coating vertically aligned carbon nanotube arrays using thermal decomposition of iron pentacarbonyl", J Vac Sci Technol. B, 30(3):03D1011-03D1013 (2012).

Dai, et al., "Controlled growth and modification of vertically-aligned carbon nanotubes for multifunctional applications", Mater. Sci, Eng., 70:63-91 (2010).

Kim, et al., "Evolution in catalyst morphology leads to carbon nanotube growth termination", J Phys. Chem, Lett, 1:918-22 (2010).

* cited by examiner

COATED ELECTRICAL CONNECTORS AND METHODS OF MAKING AND USING THEREOF

FIELD OF THE INVENTION

This invention is in the field of electrical connectors, particularly connectors coated with carbon nanotube arrays or sheets, as well as methods of making and using thereof.

BACKGROUND OF THE INVENTION

Electrical interconnection between two electrical conductors may be achieved by electrical contacts using an electrical connector typically having a lug portion with a hole(s) for connecting two electrical conductors to each other and are well known in the art.

Electrical connectors are typically made from material(s) having low bulk resistivity, such as copper, copper alloy, aluminum, or aluminum alloy. In some instances, when electrical connectors are in use and interfaced they can require the presence interface greases. Contact resistance, the resistance (in ohms) between mated electrical components of a connector, is an important aspect of their operation. Additionally, these interfaced connectors can suffer from issues related to thermal expansion and interface stresses, as well as sensitivity to moisture exposure.

Thus, there is a need for electrical connectors and methods of making thereof that address known issues as described above.

Therefore, it is an object of the invention to provide electrical connectors with a coating thereon that can reduce or eliminate issues including the need for interface greases, provide hydrophobic properties, and reduce or eliminate thermal expansion and interface stress issues.

It is also an object of the invention to provide for methods of making such coated electrical connectors.

SUMMARY OF THE INVENTION

Electrical connectors coated with carbon nanotube arrays or sheets and methods of making and using thereof are described herein. Electrical connectors are known in the art and can include various types of connectors and may be made of metal, metal alloys, or combinations thereof. Coated electrical connectors, as described here, typically include a first connection section and a second connection section. The first and/or second connection sections can include, but are not limited to, lug, fork, tube, crimp/crimpable, blade, butt, plug and socket, twist on, screw, and amphenol type connectors, as well as other types of electrical connector sections known in the art. The coated electrical connectors can have any suitable size and/or shape known suitable for their purpose and use.

The electrical connectors described herein include a coating material thereon which contains carbon nanotube array(s) or sheet(s) grown on a metal substrate. The coating is typically formed of a single tiered or single layered structure or a multitiered or multilayered structure formed from carbon nanotube arrays or sheets, as described in detail below. The coating is applied to one or more surfaces of the electrical connector. The coating is typically formed and then adhered on to a surface(s) of the electrical connector and is optionally removable (such as by peeling), when necessary, from the electrical connector (requiring little to no scraping for removal and leaving little to no residue or debris when the coating is peeled off the connector).

The coating on the electrical connector may be placed on one or more surfaces of the electrical connector, such as the first and/or second connection sections described. In some instances, the entirety of a connection section of the connector is coated. In some instances, about 20%, 30%, 40%, 50%, 60%, 70%, 80%, 90%, or more of each of the surfaces of the connection section can be coated.

The coatings for electrical connectors are formed from carbon nanotube (CNT) arrays or carbon nanotube (CNT) sheets supported on, or attached to, the surface of an inert substrate/support, as described below. The CNT array or sheet can include a coating material thereon which adheres or is bonded to the CNTs.

The coatings for electrical connectors can be formed of multiple CNT arrays or sheets described which are stacked according to the methods described below to afford multi-layered or multitiered structures. A non-limiting example of a three layered/tiered structure is shown in the schematic of FIG. 4B. A layer or tier is formed by contacting/stacking the carbon nanotubes of two CNT arrays or sheets, which interdigitate at least partially, and which may optionally be coated with a suitable coating material as described herein. In some embodiments the multilayered or multitiered structures can further include a coating, a coating of metallic nanoparticles, and/or a coating of flowable or phase change materials on the nanostructure elements, such as CNTs, of the arrays.

The thickness of the resulting multilayered or multitiered structures formed by stacking can be in the range 1-10,000 microns or more. In some embodiments, the thickness of the resulting multilayered or multitiered structures formed by stacking can be 1-3,000 micrometers, even more preferably 70-3,000 micrometers. In some embodiments, the number of layers and/or thickness is based on the thickness of the CNT forest formed on the arrays used in the stacking process.

The electrical connector coatings formed from one or more carbon nanotube arrays or carbon nanotube can be flexible and conformable. The coatings can be manufactured to have any shape and size suitable for covering a defined surface or portion thereof on an electrical connector. In some instances, the coatings form an O-ring shape suitable to cover the hole(s) of a lug-type electrical connector (see FIGS. 1 and 2) but any shape can be made to suit other known types of electrical connectors. In some instances sheets, tapes, or rolls of the coating are manufactured and the desired shape of the coating can be cut out or punched out of the sheets, tapes, or rolls. In some instances, the coating thickness is in the range of between about 70 to 2000 microns or between about 70 to 1000 microns.

The electrical connector coatings on the electrical connectors can provide increased conductivity and allow for electrical contacts with electrical resistances in the milliohm range. The electrical connector coatings impart hydrophobicity or superhydrophobicity to the portions of the electrical connectors coated. The coatings also serve to eliminate thermal expansion issues at interfaces between the coated part of the electrical connector in contact with other electrical parts or components. The use of coatings can reduce, eliminate, or relax interface stresses experienced during use of the coated electrical connectors when interfaced with other electrical parts or components. The use of coatings can also eliminate the need for using interface greases which are typically used electrical connectors are interfaced, and which can suffer from thermal expansion issues. The coatings can reduce galvanic corrosion when joining dissimilar types of metals. The coatings can also serve to remove native oxides from metal surfaces when making initial contact, as well as prevent the buildup of native oxides during operation/service and over the lifetime of use of the electrical connector.

The electrical connector coatings may themselves be adhesive. In some other instances, if the coatings are not adhesive they may further include one or more additional layers, such as an adhesive layer thereon. The adhesive may be selected from a hot glue or a hot melt adhesive that combines wax, tackifiers and a polymer base to provide improved adhesion properties to one or more surfaces. In some embodiments, the adhesive is a pressure sensitive adhesive. In certain other embodiments, the adhesive is a monomer that polymerizes upon contact with air or water, such as a cyanoacrylate. In yet other embodiments, the adhesive is a combination of a pressure sensitive adhesive and a thermally activated (or activatable) adhesive polymers which enhances ease of adhesion of the coatings described herein to a surface(s), by way of the pressure sensitive adhesive and additional and more permanent or semi-permanent adhesion by way of the thermal adhesive. In some embodiments, the adhesive is an epoxy adhesive. Adhesive coatings described herein of any form can also be removable (such as by peeling). When necessary or desired, the coatings can be removed from the electrical connector (requiring little to no scraping for removal and leaving little to no residue or debris when the coating is peeled off the connector). Ease of removal of the coatings is beneficial for replacing an old or worn out coating with a new coating. In some instances, when an electrical connector is to be recycled it is advantageous to be able to remove the coating prior to recycling the metal of the electrical connector.

Methods of preparing coated electrical connectors are provided herein. In one non-limiting example, a method of making a coated electrical connector includes the steps of:
(a) providing an electrical connector;
(b) applying a coating which includes at least a first layer or tier formed from a carbon nanotube array or sheet formed on a metal substrate to at least a portion of the electrical connector.

In another non-limiting example, a method of making a coated electrical connector includes the steps of:
(a) providing an electrical connector;
(b) providing a coating which includes at least a first layer or tier formed from a carbon nanotube array or sheet formed on a metal substrate; and
(c) applying the coating to at least a portion of the electrical connector.

In some instances, the methods involve the application of two or more coatings on the electrical connector.

The electrical connector coatings prepared according to the methods described below may be single tiered or single layered structure coatings or multitiered or multilayered structure coatings. Methods of preparing the coatings used in the above methods are described below. The coatings may be adhesive as noted above. The coatings need not be adhesive but may include a further step of applying one or more additional layers thereon, such as an adhesive layer, as described above.

The coatings may be formed as sheets, tapes, rolls, of any shape or size suited for application to an electrical connector. In some instances, the coatings form an O-ring shape suitable to cover the hole(s) of a lug-type electrical connector (see FIGS. 1 and 2) but any shape can be made to suit other known types of electrical connectors. In some instances sheets, tapes, or rolls of the coating are manufactured and the desired shape of the coating can be cut out or punched out of the sheets, tapes, or rolls. The coating can have any suitable thickness. In some instances, the coating thickness is in the range of between about 70 to 2000 microns or between about 70 to 1000 microns.

The coated electrical connectors are well suited for interfacing electrical connections. The coated electrical connectors are suitable for industrial and residential applications. The coated electrical connectors described can be used in the manufacture of electrical systems for homes and building, personal computers and components thereof, server computers and components thereof, memory modules, graphics chips, radar and radio-frequency (RF) devices, disc drives, displays, including light-emitting diode (LED) displays, lighting systems, pipes, automotive control units, power-electronics, solar cells, batteries, communications equipment, such as cellular phones, thermoelectric generators, imaging equipment including MRIs, power transmission, aircraft terminals, and undersea data and power transmission.

DETAILED DESCRIPTION OF THE INVENTION

I. Definitions

"Compliant" or "Compliance," as used herein, refers to the ability of a material to conform when contacted to one or more surfaces such that efficient conformance to the asperities of the adjoining surface results in sufficient or high contact areas at the interfaces between the surfaces and the material.

"Interdigitation" or "Interdigitating", as used herein, refers to the ability and or degree which one or more individual nanostructure elements of an array or sheet to infiltrate or penetrate into the adjacent nanostructure elements of another array or sheet when the two different arrays or sheets are contacted or stacked.

"Carbon Nanotube Array" or "CNT array" or "CNT forest", as used herein, refers to a plurality of carbon nanotubes which are vertically aligned on a surface of a material. Carbon nanotubes are said to be "vertically aligned" when they are substantially perpendicular to the surface on which they are supported or attached. Nanotubes are said to be substantially perpendicular when they are oriented on average within 30, 25, 20, 15, 10, or 5 degrees of the surface normal.

"Carbon Nanotube Sheet" or "CNT sheet", as used herein, refers to a plurality of carbon nanotubes which are aligned in plane to create a free-standing sheet. Carbon nanotubes are said to be "aligned in plane" when they are substantially parallel to the surface of the sheet that they form. Nanotubes are said to be substantially parallel when they are oriented on average greater than 40, 50, 60, 70, 80, or 85 degrees from sheet surface normal.

"Coating material" as used herein, generally refers to polymers and/or molecules that can bond to CNTs through van der Waals bonds, π-π stacking, mechanical wrapping and/or covalent bonds and bond to metal, metal oxide, or semiconductor material surfaces through van der Waals bonds, π-π stacking, and/or covalent bonds.

"Elastic recovery" as used herein, refers to the ability of a material to return to its original shape following compression, expansion, stretching, or other deformation.

"Compression set" as used herein, refers to the permanent deformation of a material which remains when a force, such as compression, was applied to the material and the force was subsequently removed.

Numerical ranges disclosed in the present application include, but are not limited to, ranges of temperatures, ranges of pressures, ranges of molecular weights, ranges of integers, ranges of conductance and resistance values, ranges of times, and ranges of thicknesses. The disclosed ranges of any type, disclose individually each possible number that such a range could reasonably encompass, as well as any sub-ranges and combinations of sub-ranges encompassed therein. For example, disclosure of a pressure range is intended to disclose individually every possible pressure value that such a range could encompass, consistent with the disclosure herein.

Use of the term "about" is intended to describe values either above or below the stated value, which the term "about" modifies, in a range of approx. +/−10%; in other instances the values may range in value either above or below the stated value in a range of approx. +/−5%. When the term "about" is used before a range of numbers (i.e., about 1-5) or before a series of numbers (i.e., about 1, 2, 3, 4, etc.) it is intended to modify both ends of the range of numbers or each of the numbers in the series, unless specified otherwise.

II. Coated Electrical Connectors

Electrical connectors are known in the art. Electrical connectors can include type connectors having one or more holes which are commercially available. Other types of electrical connectors known can also be used. Electrical connectors are usually made of metal, metal alloys, or combinations thereof. Exemplary metals and alloys include, but are not limited to copper, copper alloys, aluminum, aluminum alloys, titanium and stainless steel. In some instances, the electrical connectors may be plated completely or partially (i.e., 10%, 20%, 30%, 40%, 50%, 60%, 70%, 80%, 90%, or higher of the total surface area of the electrical connector) with one or more conductive coatings such as, but not limited to, tin, silver, gold chrome, nickel, nickel alloys, nickel in combination with PTFE, zinc, zinc alloys, aluminum, aluminum alloys., for passivation, corrosion resistance, lubricity, other surface modifications, or combinations thereof. The electrical connectors can have any suitable size and/or shape known suitable for their purpose and use.

The coated electrical connectors typically include a first connection section and a second connection section. The first and/or second connection sections can include, but are not limited to, lug, fork, tube, crimp/crimpable, blade, butt, plug and socket, twist on, screw, and amphenol type connectors, as well as other types of electrical connector sections known in the art.

The electrical connectors described herein include a coating material thereon which contains carbon nanotube array(s) or sheet(s) grown on a metal substrate. The coating is typically formed of a single tiered or single layered structure or a multitiered or multilayered structure formed from carbon nanotube arrays or sheets, as described in detail below. The coating is applied to one or more surfaces of the electrical connector. The coating is typically formed and then adhered on to a surface(s) of the electrical connector and is optionally removable (such as by peeling), when necessary, from the electrical connector (requiring little to no scraping for removal and leaving little to no residue or debris when the coating is peeled off the connector).

The coating on the electrical connector may be placed on one or more surfaces of the electrical connector, such as the first and/or second connection sections described. In some instances, only the hole(s) of the connector are covered by the coating either on one side or both sides of the hole(s). In some instances the entirety of the hole(s) is covered from one side of the hole through the other side of the same hole. In some instances, the entire lug section of the connector is coated. In some instances, about 20%, 30%, 40%, 50%, 60%, 70%, 80%, 90%, or more of each of the surfaces of the lug section can be coated.

Figure 1:
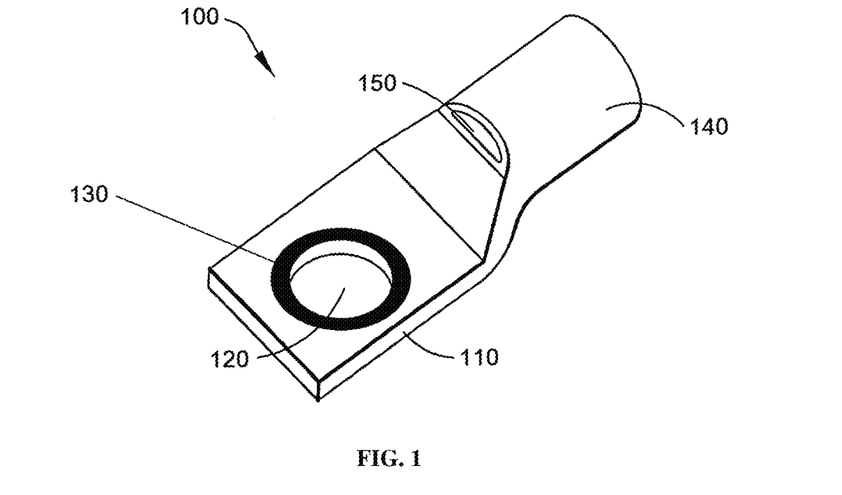
FIG. 1 shows a non-limiting schematic of a coated electrical connector 100 having a lug section 110, a hole 120, a coating material 130, an optional tube section 140 which forms a cable or electrical wire receiving area which may also include coating material 130 thereon (not shown), and where the optional tube section may include an optional inspection window 150. The lug section 110 can be mounted to another member, such as a mounting post (not shown).

As shown in FIG. 1, a non-limiting schematic of a coated electrical connector 100 includes a lug section 110, a hole 120, a coating material 130, an optional tube section 140 which forms a cable or electrical wire receiving area having an optional inspection window 150. The optional tube section may also be coated with a coating material 130 (not shown). The lug section 110 can be mounted to another member, such as a mounting post (not shown).

Figure 2:
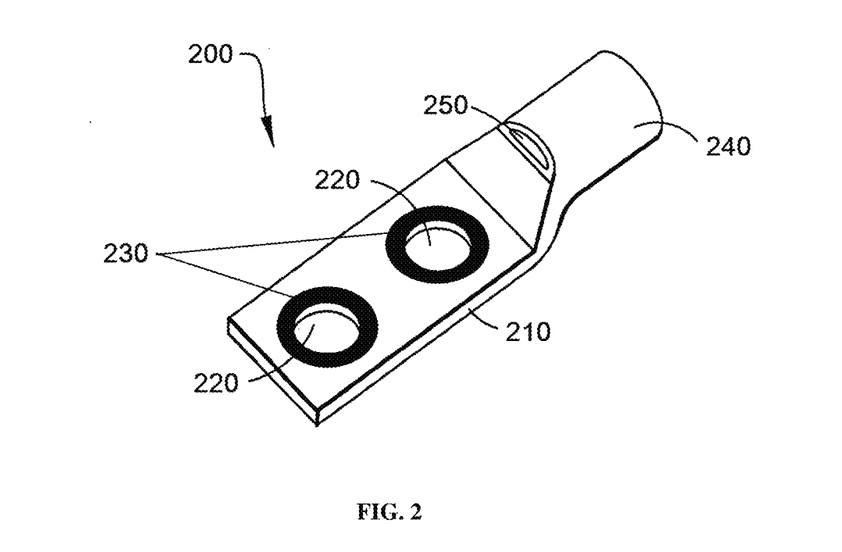
FIG. 2 shows a non-limiting schematic of a coated electrical connector 200 having a lug section 210, two holes 220, a coating material 230 on both holes, an optional tube section 240 which forms a cable or electrical wire receiving area which may also include coating material 230 thereon (not shown), and where the optional tube section may include an optional inspection window 250. The lug section 210 can be mounted to other members, such as mounting posts (not shown).

As shown in FIG. 2, a non-limiting schematic of a coated electrical connector 200 includes a lug section 210, two holes 220, a coating material 230 on both holes, an optional tube section 240 which forms a cable or electrical wire receiving area having an optional inspection window 250. The optional tube section may also be coated with a coating material 230 (not shown). The lug section 210 can be mounted to other members, such as mounting posts (not shown).

Figure 3A:
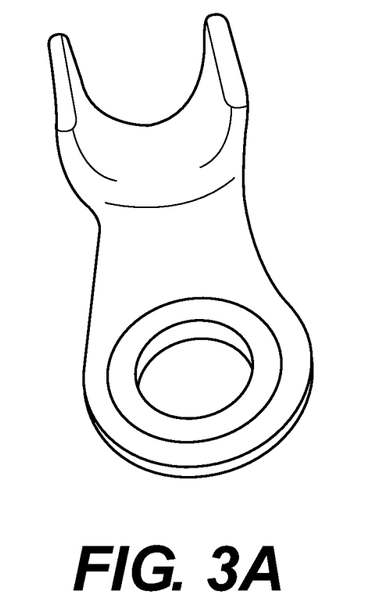
FIG. 3A shows a non-limiting example of a lug style electrical connector having a coating material on the lug portion of the connector and an uncoated crimp portion of the electrical connector's terminal.
Figure 3B:
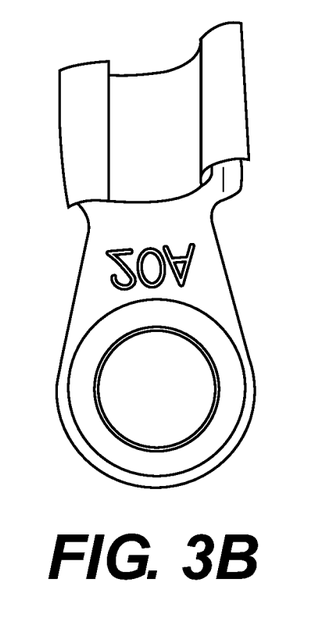
FIG. 3B shows a non-limiting example of a lug style electrical connector having a coating material on both the lug portion and the crimp portion of terminal of the electrical connector.

As shown in FIGS. 3A and 3B, in some instances the coated electrical connectors include a coated lug section where the hole is coated and a crimp/crimpable section of the connector's terminal where the entire surface of the crimp/crimpable section that clamps around a cable or electrical wire can also be coated by a coating material (see FIG. 3B), as described herein.

III. Coatings for Electrical Connectors Formed from Carbon Nanotube Arrays or Sheets The coatings for electrical connectors are formed from carbon nanotube arrays or carbon nanotube sheets supported on, or attached to, the surface of an inert substrate/support, as described below.

A. Carbon Nanotube Arrays

Carbon nanotube arrays are contain a plurality of carbon nanotubes supported on, or attached to, the surface of an inert substrate/support, such as a metallic (e.g., Al or Au) foil, metal alloys (i.e., steel). In some embodiments, the substrate/support can be a flexible, electrically, and thermally conductive substrate, such as graphite or other carbon-based material. In yet other embodiments, the substrate/support can be an electrically insulating substrate such as a flexible ceramic. The CNT arrays can be formed using the methods described below. The CNTs are vertically aligned on the substrate/support. CNTs are said to be "vertically aligned" when they are substantially perpendicular to the surface on which they are supported or attached. Nanotubes are said to be substantially perpendicular when they are oriented on average within 30, 25, 20, 15, 10, or 5 degrees of the surface normal.

Generally, the nanotubes are present at a sufficient density such that the nanotubes are self-supporting and adopt a substantially perpendicular orientation to the surface of the multilayer substrate. Preferably, the nanotubes are spaced at optimal distances from one another and are of uniform height to minimize thermal transfer losses, thereby maximizing their collective thermal diffusivity.

The CNT arrays contain nanotubes which are continuous from the top of the array (i.e., the surface formed by the distal end of the carbon nanotubes when vertically aligned on the multilayer substrate) to bottom of the array (i.e., the surface of the multilayer substrate). The array may be formed from multi-wall carbon nanotubes (MWNTs), which generally refers to nanotubes having between approximately 4 and approximately 10 walls. The array may also be formed from few-wall nanotubes (FWNTs), which generally refer to nanotubes containing approximately 1-3 walls. FWNTs include single-wall carbon nanotubes (SWNTs), double-wall carbon nanotubes (DWNTS), and triple-wall carbon nanotubes (TWNTs). In certain embodiments, the nanotubes are MWNTs. In some embodiments, the diameter of MWNTs in the arrays ranges from 5 to 40 nm, more preferably 15 to 30 nm, most preferably about 20 nm. The length of CNTs in the arrays can range from 1 to 5,000 micrometers, preferably 5 to 5000 micrometers, preferably 5 to 2500 micrometers, more preferably 5 to 2000 micrometers, more preferably 5 to 1000 micrometers. In some embodiments, the length of CNTs in the arrays can range from 1-500 micrometers, even more preferably 1-100 micrometers.

The CNTs display strong adhesion to the multilayer substrate. In certain embodiments, the CNT array or sheet will remain substantially intact after being immersed in a solvent, such as ethanol, and sonicated for a period of at least five minutes. In particular embodiments, at least about 90%, 95%, 96%, 97%, 98%, 99%, or 99.9% of the CNTs remain on the surface after sonication in ethanol.

B. Carbon Nanotube Sheets

Carbon nanotube sheets are also described herein. The sheets contain a plurality of carbon nanotubes that support each other through strong van der Waals force interactions and mechanical entanglement to form a freestanding material. The CNT sheets can be formed using the methods described below. The CNTs form a freestanding sheet and are aligned in plane with the surface of this sheet. CNTs are said to be "aligned in plane" when they are substantially parallel to the surface of the sheet that they form. Nanotubes are said to be substantially parallel when they are oriented on average greater than 40, 50, 60, 70, 80, or 85 degrees from sheet surface normal.

Generally, the nanotubes are present at a sufficient density such that the nanotubes are self-supporting and adopt a substantially parallel orientation to the surface of the sheet. Preferably, the nanotubes are spaced at optimal distances from one another and are of uniform length to minimize thermal transfer losses, thereby maximizing their collective thermal diffusivity.

The CNT sheets may be formed from multi-wall carbon nanotubes (MWNTs), which generally refers to nanotubes having between approximately 4 and approximately 10 walls. The sheets may also be formed from few-wall nanotubes (FWNTs), which generally refers to nanotubes containing approximately 1-3 walls. FWNTs include single-wall carbon nanotubes (SWNTs), double-wall carbon nanotubes (DWNTS), and triple-wall carbon nanotubes (TWNTs). In certain embodiments, the nanotubes are MWNTs. In some embodiments, the diameter of MWNTs in the arrays ranges from 5 to 40 nm, more preferably 15 to 30 nm, most preferably about 20 nm. The length of CNTs in the sheets can range from 1 to 5,000 micrometers, preferably 100 to 5000 micrometers, preferably 500 to 5000 micrometers, more preferably 1000 to 5000 micrometers. In some embodiments, the length of CNTs in the sheets can range from 1-500 micrometers, even more preferably 1-100 micrometers.

C. Carbon Nanotube Coating Materials

The CNT array or sheet can include a coating material which adhere or are bonded to the CNTs. The coating/coating material can be applied as described below. In some embodiments, the coating contains one or more oligomeric materials, polymeric materials, waxes, or combinations thereof. In other embodiments, the coating contains one or more non-polymeric materials. In some embodiments, the coating can contain a mixture of oligomeric, waxes, and/or polymeric material and non-polymeric materials.

In certain embodiments, the coating material(s) act as a bonding agent(s) which can bonded, such as chemically, the carbon nanotubes of the stacked arrays or sheets. Without limitation, such coating material(s) which can act as bonding agents(s) can be selected from adhesives (i.e., acrylate adhesives) and a phase change material (i.e., a wax or waxes).

In some embodiments, the coating which adheres or is bonded to the CNTs of an array is applied before two or more CNT arrays or sheets are stacked while in other embodiments, the coating which adheres or is bonded to the CNTs of an array is applied following stacking of two or more CNT arrays or sheets. In yet other embodiments, the coating is infiltrated or backfilled into multilayered or multitiered structures formed of stacked CNT arrays or sheets and adheres or is bonded to the CNTs of the arrays forming the structure. As used herein, "infiltration" or "infiltrated" refer to a coating material(s) which are permeated through at least some of the carbon nanotubes of the arrays or sheets which were stacked to form the multilayered or multitiered structures. In some embodiments, the extent of infiltration is in the range of 0.1-99.9%. In some embodiments, the infiltrated coating material at least partially fills the interstitial space between carbon nanotubes while in some other embodiments the infiltrated coating coats at least some of the surfaces of the carbon nanotubes, or both. In some embodiments, the infiltrated coating material fills the all or substantially all (i.e., at least about 95%, 96%, 97%, 98%, or 99%) of the interstitial space between carbon nanotubes present in the tiers or layers of the structure formed by stacking of the CNT arrays or sheets.

A variety of materials can be coated onto the CNT arrays or sheets, prior to stacking, during stacking, or following stacking. The coatings can be applied conformally to coat the tips and/or sidewalls of the CNTs. It is also desirable that the coating be reflowable as the interface is assembled using, for example, solvent, heat or some other easy to apply source. Polymers used as coatings must be thermally stable up to at least 130° C. In some embodiments, the coating is readily removable, such as by heat or dissolution in a solvent, to allow for "reworking" of the interface. "Reworking", as used herein, refers to breaking the interface (i.e., removing the coating) by applying solvent or heat.

1. Polymeric Carbon Nanotube Coating Materials

In some embodiments, the coating is, or contains, one or more polymeric materials. The polymer coating can contain a conjugated polymer, such as an aromatic, heteroaromatic, or non-aromatic polymer, or a non-conjugated polymer.

Suitable classes of conjugated polymers include polyaromatic and polyheteroaromatics including, but not limited to, polythiophenes (including alkyl-substituted polythiophenes), polystyrenes, polypyrroles, polyacetylenes, polyanilines, polyfluorenes, polyphenylenes, polypyrenes, polyazulenes, polynaphthalenes, polycarbazoles, polyindoles, polyazepines, poly(3,4-ethylenedioxythiophenes), poly(p-phenyl sulfides), and poly(p-phenylene vinylene). Suitable non-aromatic, conjugated polymers include, but are not limited to, polyacetylenes and polydiacetylenes. The polymer classes listed above include substituted polymers, wherein the polymer backbone is substituted with one or more functional groups, such as alkyl groups. In some embodiments, the polymer is polystyrene (PS). In other embodiments, the polymer is poly(3-hexythiophene) (P3HT). In other embodiments, the polymer is poly(3,4-3thylenedioxythiophene) (PEDOT) or poly(3,4-3thylenedioxythiophene) poly(styrenesulfonate) (PEDOT:PSS).

In other embodiments, the polymer is a non-conjugated polymer.

Suitable non-conjugated include, but are not limited to, polyvinyl alcohols (PVA), poly(methyl methacrylates) (PMMA), polydimethylsiloxanes (PDMS), polyurethane, silicones, acrylics, and combinations (blends) thereof.

In other embodiments, the polymer is a paraffin wax. In other embodiments, the polymer is a synthetic wax such as Fischer-Tropsch waxes or polyethylene waxes. In other embodiments, the polymer is a wax that has a melting temperature above 80, 90, 100, 110, or 120° C., preferably above 130° C.

In other embodiments, the polymer is an adhesive, such as, but not limited to, a hot glue or hot melt adhesive that combines wax, tackifiers and a polymer base to provide improved adhesion properties to one or more surfaces. In some embodiments, the adhesive is a pressure sensitive adhesive.

In certain other embodiments, the adhesive is a monomer that polymerizes upon contact with air or water such as a cyanoacrylate. In yet other embodiments, the adhesive is a combination of a pressure sensitive adhesive and a thermally activated (or activatable) adhesive polymers which enhances ease of adhesion of a multilayered or multitiered structure described herein which includes such a combination of coatings to a surface(s), by way of the pressure sensitive adhesive and additional and more permanent or semi-permanent adhesion by way of the thermal adhesive.

D. Other Coating Materials

1. Metallic Nanoparticles

The CNT arrays or sheets can additionally be coated with one or more metal nanoparticles. One or more metal nanoparticles may be adsorbed to the distal ends and/or sidewalls of the CNTs to bond the distal ends and/or sidewalls of the CNTs to a surface, reduce thermal resistance between the CNT array or sheet and a surface, or combinations thereof. Metal nanoparticles can be applied to CNT arrays or sheets using a variety of methods known in the art.

Examples of suitable metal nanoparticles include palladium, gold, silver, titanium, iron, nickel, copper, and combinations thereof.

2. Flowable or Phase Change Materials

In certain embodiments, flowable or phase change materials are applied to the CNT arrays or sheets prior to stacking, during stacking, or following stacking. Flowable or phase change materials may be added to the CNT array or sheet to displace the air between CNTs and improve contact between the distal ends and/or sidewalls of CNTs and a surface, and as a result reduce thermal resistance of the array or sheet and the contact between the array or sheet and a surface, or combinations thereof. Flowable or phase change materials can be applied to CNT arrays using a variety of methods known in the art.

Examples of suitable flowable or phase change materials include paraffin waxes, polyethylene waxes, hydrocarbon-based waxes in general, and blends thereof. Other examples of suitable flowable or phase change materials that are neither wax nor polymeric include liquid metals, oils, organic-inorganic and inorganic-inorganic eutectics, and blends thereof. In some embodiments, the coating material, such as a non-polymeric coating material and the flowable or phase change material are the same material or materials.

E. Multilayered or Multitiered Carbon Nanotube Structure-Based Coatings

The coatings may also be formed from the CNT arrays or sheets described above which are stacked according to the methods described below to afford multilayered or multitiered structures. A non-limiting example of a three layered/tiered structure is shown in the schematic of FIG. 3B. A layer or tier is formed by contacting/stacking the carbon nanotubes of two CNT arrays or sheets, which interdigitate at least partially, and which may optionally be coated with a suitable coating material as described herein.

In some embodiments the multilayered or multitiered structures can further include a coating, a coating of metallic nanoparticles, and/or a coating of flowable or phase change materials on the nanostructure elements, such as CNTs, of the arrays.

Figure 4:
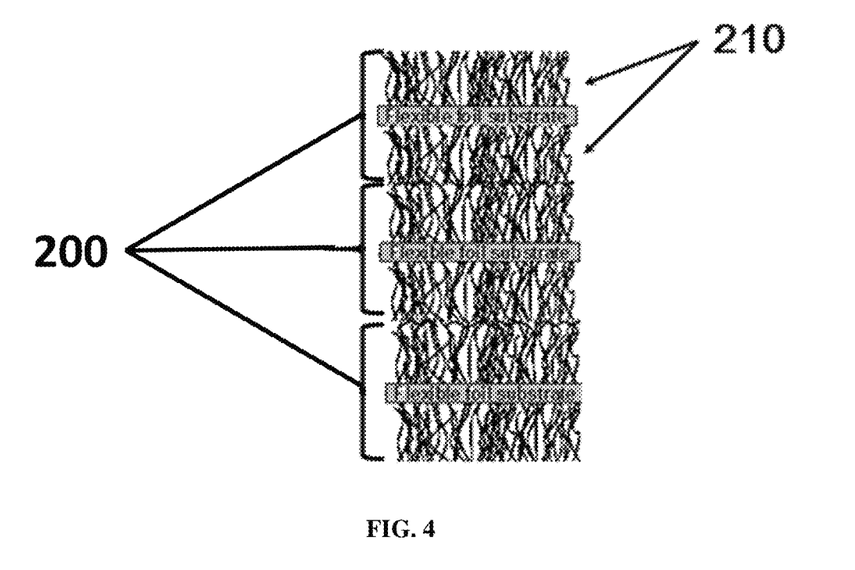
FIG. 4 shows a non-limiting illustration of a coating having three tiers, 200, with arrays or sheets of carbon nanotubes, 210, on each side of substrates.

At least two CNT arrays or sheets can be stacked to form the multilayered or multitiered structures. For example, FIG. 4 shows stacking of three CNT arrays (right side). By using more CNT arrays the thickness of the multilayered or multitiered structures can be increased as needed. In some embodiments, up to 5, 10, 15, 20, 25, 30, or more CNT arrays or sheets can be stacked according to the method described above. The thickness of the resulting multilayered or multitiered structures formed by stacking can be in the range 1-10,000 microns or more. In some embodiments, the thickness of the resulting multilayered or multitiered structures formed by stacking can be 1-3,000 micrometers, even more preferably 70-3,000 micrometers. In some embodiments, the number of layers and/or thickness is based on the thickness of the CNT forest formed on the arrays used in the stacking process.

In a non-limiting embodiment, at least two vertically aligned arrays or sheets formed on supports/substrates are stacked/contacted such that the nanostructure elements, such as CNTs, of the arrays at least partially interdigitate on contact. In one embodiment, full interdigitation of nanostructure elements of the arrays occurs within one another when stacked. In other embodiments the arrays may interdigitate only at the tips of the nanostructure elements, such as CNTs. In yet other embodiments, the individual nanostructures can navigate through the nanostructures of the adjacent array during the interdigitating process and the nanostructure elements of the individual arrays, such as the CNTs or some portion thereof, fully or substantially interdigitate within one another; "substantially," as used herein, refers to at least 95%, 96%, 97%, 98%, or 99% interdigitation between the nanostructure elements of the individual arrays. In some embodiments, the extent of interdigitation is in the range of about 0.1% to 99% or at least about 1%, 5%, 10%, 20%, 30%, 40%, 50%, 60%, 70%, 80%, 90%, or 95%.

In some embodiments the nanostructures of the stacked arrays, which interdigitate at least partially, may also form into larger superstructures, such as, but not limited to, tube bundles, clumps, or rows. These superstructures may be formed through mechanisms such as capillary clumping or by way of application of a polymer coating prior to, during, or following the stacking process.

In some embodiments, a polymer coating and/or adhesive, or other coating as described above, is applied to the CNT array(s) which are subsequently stacked. In such embodiments, the thickness of the coating and/or adhesive, or other coating as described above, is about 1-1000 nm, more preferable 1-500 nm, and most preferably 1-100 nm.

In addition to the above, the favorable deformation mechanics of CNTs present in the multilayered or multi-tiered structures allow them to efficiently conform to the asperities of adjoining surfaces, resulting in high contact areas at the interfaces.

F. Parameters and Properties of Coatings

The coatings described above can be formed from carbon nanotube arrays or carbon nanotube sheets supported on, or attached to, the surface of an inert substrate/support. The coatings are flexible and conformable. The coatings can be manufactured to have any shape and size suitable for covering a defined surface or portion thereof on an electrical connector. In some instances, the coatings form an O-ring shape suitable to cover the hole(s) of a lug-type electrical connector (see FIGS. 1 and 2) but any shape can be made to suit other known types of electrical connectors. In some instances sheets, tapes, or rolls of the coating are manufactured and the desired shape of the coating can be cut out or punched out of the sheets, tapes, or rolls. In some instances, the coating thickness is in the range of between about 70 to 2000 microns or between about 70 to 1000 microns.

The coatings on the electrical connectors can provide increased conductivity which is at least about 2 times, 3 times, 4 times, 5 times, 6 times, 7 times, 8 times, 9 times, 10 times, 11 times, 12 times, 13 times, 14 times, 15 times, 16 times, 17 times, 18 times, 19 times, 20 times, 21 times, 22 times, 23 times, 24 times, 25 times, or greater than the conductivity of an uncoated connector or a connector coated with a graphite-based gasket. In certain embodiments, the coatings on the electrical connectors allow for electrical contacts with electrical resistances in the milliohm range. In some instances, the electrical resistance is less than about 1000, 900, 800, 700, 600, 500, 400, 300, 200, 100, 75, 50, 25, 20, 15, 10, 9, 8, 7, 6, 5, 4, 3, 2, 1, 0.9, 0.8, 0.7, 0.6, 0.5, 0.4, 0.3, 0.2, or 0.1 milliohms.

The coatings described impart hydrophobicity or super-hydrophobicity to the portions of the electrical connectors coated. The coatings also serve to eliminate thermal expansion issues at interfaces between the coated part of the electrical connector in contact with other electrical parts or components. The use of coatings can reduce, eliminate, or relax interface stresses experienced during use of the coated electrical connectors when interfaced with other electrical parts or components. The use of coatings can also eliminate the need for using interface greases which are typically used electrical connectors are interfaced, and which can suffer from thermal expansion issues. The coatings can reduce galvanic corrosion when joining dissimilar types of metals. The coatings can also serve to remove native oxides from metal surfaces when making initial contact, as well as prevent the buildup of native oxides during operation/service and over the lifetime of use of the electrical connector.

The coatings may themselves be adhesive. In some other instances, if the coatings are not adhesive they may further include one or more additional layers, such as an adhesive layer thereon. The adhesive may be selected from a hot glue or a hot melt adhesive that combines wax, tackifiers and a polymer base to provide improved adhesion properties to one or more surfaces. In some embodiments, the adhesive is a pressure sensitive adhesive. In certain other embodiments, the adhesive is a monomer that polymerizes upon contact with air or water, such as a cyanoacrylate. In yet other embodiments, the adhesive is a combination of a pressure sensitive adhesive and a thermally activated (or activatable) adhesive polymers which enhances ease of adhesion of the coatings to a surface(s), by way of the pressure sensitive adhesive and additional and more permanent or semi-permanent adhesion by way of the thermal adhesive. In some embodiments, the adhesive is an epoxy adhesive. Adhesive coatings described herein of any form can also be removable (such as by peeling). When necessary or desired, the coatings can be removed from the electrical connector (requiring little to no scraping for removal and leaving little to no residue or debris when the coating is peeled off the connector). Ease of removal of the coatings is beneficial for replacing an old or worn out coating with a new coating. In some instances, when an electrical connector is to be recycled it is advantageous to be able to remove the coating prior to recycling the metal of the electrical connector.

The coatings described are optionally reformable. A reformable coating can be heated and reformed into a new shape to conform to a surface(s), such as the hole(s) or surface topographies, of an electrical connector. A reformable coating can be customized to any desired shape.

IV. Methods for Preparing Coated Electrical Connectors

Methods of preparing coated electrical connectors are provided herein. In one non-limiting example, a method of making a coated electrical connector includes the steps of:
(a) providing an electrical connector;
(b) applying a coating which includes at least a first layer or tier formed from a carbon nanotube array or sheet formed on a metal substrate to at least a portion of the electrical connector.

In another non-limiting example, a method of making a coated electrical connector includes the steps of:
(a) providing an electrical connector;
(b) providing a coating which includes at least a first layer or tier formed from a carbon nanotube array or sheet formed on a metal substrate; and
(c) applying the coating to at least a portion of the electrical connector.

In some instances, the coating applied is formed of a single tiered or single layered structure or a multitiered or multilayered structure formed from carbon nanotube arrays or sheets, as described in detail above. In some instances, the methods involve the application of two or more coatings on the electrical connector.

Electrical connectors are known in the art. Electrical connectors can include various types of connectors having one or more holes which are commercially available. Other types of electrical connectors known can also be used. Electrical connectors are usually made of metal, metal alloys, or combinations thereof. Exemplary metals and alloys include, but are not limited to copper, copper alloys, aluminum, aluminum alloys, titanium, and stainless steel. The electrical connectors can have any suitable size and/or shape known suitable for their purpose and use.

The coating can be applied to one or more surfaces of the electrical connector by any suitable method. Typically the coating is adhered on to a surface(s) of the electrical connector and is optionally removable (such as by peeling), when necessary, from the electrical connector (requiring little to no scraping for removal and leaving little to no residue or debris when the coating is peeled off the connector). Applying the coating may include the optional use of heating and/or application of heating during the applying step.

The coating on the electrical connector may be placed on one or more surfaces or sides of the electrical connector and are typically placed on the hole(s) on lug-type connectors. In some instances, only the hole(s) of the connector are covered by the coating either on one side or both sides of the hole(s). In some instances the entirety of the hole(s) is covered from one side of the hole through the other side of the same hole. In some instances, the entire lug section of the connector is coated. In some instances, about 20%, 30%, 40%, 50%, 60%, 70%, 80%, 90%, or more of each of the surfaces of the lug section can be coated. In some instances, the compression fitting portion of the electrical connector is coated where it is intended to make contact with the electrical wire(s).

A. Single Tiered or Single Layered Coatings

1. Carbon Nanotube Arrays

Carbon nanotube arrays can be prepared using techniques well known in the art. In one embodiment, the arrays are prepared as described in U.S. Publication No. 2014-0015158-A1, incorporated herein by reference. This method involves the use of multilayer substrates to promote the growth of dense vertically aligned CNT arrays and provide excellent adhesion between the CNTs and metal surfaces.

The multilayer substrates contain three or more layers deposited on an inert support, such as a metal surface. Generally, the multilayer substrate contains an adhesion layer, an interface layer, and a catalytic layer, deposited on the surface of an inert support. Generally, the support is formed at least in part from a metal, such as aluminum, platinum, gold, nickel, iron, tin, lead, silver, titanium, indium, copper, or combinations thereof. In certain instances, the support is a metallic foil, such as aluminum or copper foil. The support may also be a surface of a device, such as a conventional heat sink or heat spreader used in heat exchange applications.

The adhesion layer is formed of a material that improves the adhesion of the interface layer to the support. In certain embodiments, the adhesion layer is a thin film of iron. Generally, the adhesion layer must be thick enough to remain a continuous film at the elevated temperatures used to form CNTs. The adhesion layer also generally provides resistance to oxide and carbide formation during CNT synthesis at elevated temperatures.

The interface layer is preferably formed from a metal which is oxidized under conditions of nanotube synthesis or during exposure to air after nanotube synthesis to form a suitable metal oxide. Examples of suitable materials include aluminum. Alternatively, the interface layer may be formed from a metal oxide, such as aluminum oxide or silicon oxide. Generally, the interface layer is thin enough to allow the catalytic layer and the adhesion layer to diffuse across it. In some embodiments wherein the catalytic layer and the adhesion layer have the same composition, this reduces migration of the catalyst into the interface layer, improving the lifetime of the catalyst during nanotube growth.

The catalytic layer is typically a thin film formed from a transition metal that can catalyze the formation of carbon nanotubes via chemical vapor deposition. Examples of suitable materials that can be used to form the catalytic layer include iron, nickel, cobalt, rhodium, palladium, and combinations thereof. In some embodiments, the catalytic layer is formed of iron. The catalytic layer is of appropriate thickness to form catalytic nanoparticles or aggregates under the annealing conditions used during nanotube formation.

In other embodiments, the multilayer substrate serves as catalytic surface for the growth of a CNT array. In these instances, the process of CNT growth using chemical vapor deposition alters the morphology of the multilayer substrate. Specifically, upon heating, the interface layer is converted to a metal oxide, and forms a layer or partial layer of metal oxide nanoparticles or aggregates deposited on the adhesion layer. The catalytic layer similarly forms a series of catalytic nanoparticles or aggregates deposited on the metal oxide nanoparticles or aggregates. During CNT growth, CNTs form from the catalytic nanoparticles or aggregates. The resulting CNT arrays contain CNTs anchored to an inert support via an adhesion layer, metal oxide nanoparticles or aggregates, and/or catalytic nanoparticles or aggregates.

In particular embodiments, the multilayer substrate is formed from an iron adhesion layer of about 30 nm in thickness, an aluminum or alumina interface layer of about 10 nm in thickness, and an iron catalytic layer of about 3 nm in thickness deposited on a metal surface. In this embodiment, the iron adhesion layer adheres to both the metal surface and the Al (alumina nanoparticles or aggregates after growth) or $Al_2O_3$ interface layer. The iron catalytic layer forms iron nanoparticles or aggregates from which CNTs grow. These iron nanoparticles or aggregates are also bound to the alumina below.

As a result, well bonded interfaces exist on both sides of the oxide interface materials. Of metal/metal oxide interfaces, the iron-alumina interface is known to be one of the strongest in terms of bonding and chemical interaction. Further, metals (e.g., the iron adhesion layer and the metal surface) tend to bond well to each other because of strong electronic coupling. As a consequence, the CNTs are strongly anchored to the metal surface.

Further, subsurface diffusion of iron from the catalytic layer during nanotube growth is reduced because the same metal is on both sides of the oxide support, which balances the concentration gradients that would normally drive diffusion. Therefore, catalyst is not depleted during growth, improving the growth rate, density, and yield of nanotubes in the array.

In some embodiments, the CNT array is formed by vertically aligning a plurality of CNTs on the multilayer substrate described above. This can be accomplished, for example, by transferring an array of CNTs to the distal ends of CNTs grown on the multilayer substrate. In some embodiments, tall CNT arrays are transferred to the distal ends of very short CNTs on the multilayer substrate. This technique improves the bond strength by increasing the surface area for bonding.

The inert support for the CNT array or sheet can be a piece of metal foil, such as aluminum foil. In these cases, CNTs are anchored to a surface of the metal foil via an adhesion layer, metal oxide nanoparticles or aggregates, and catalytic nanoparticles or aggregates. In some instances only one surface (i.e., side) of the metal foil contains an array or sheet of aligned CNTs anchored to the surface. In other cases, both surfaces (i.e., sides) of the metal foil contain an array or sheet of aligned CNTs anchored to the surface. In other embodiments, the inert support for the CNT array or sheet is a surface of a conventional metal heat sink or heat spreader. In these cases, CNTs are anchored to a surface of the heat sink or heat spreader via an adhesion layer, metal oxide nanoparticles or aggregates, and catalytic nanoparticles or aggregates. This functionalized heat sink or heat spreader may then be abutted or adhered to a heat source, such as an integrated circuit package.

2. Carbon Nanotube Sheets

Carbon nanotube sheets can be prepared using techniques well known in the art. In one embodiment, the sheets are prepared as described in U.S. Pat. No. 7,993,620 B2. In this embodiment, CNT agglomerates are collected into sheets in-situ inside the growth chamber on metal foil substrates. The sheets can then be densified by removing the solvent. In another embodiment, the CNT sheets are made by vacuum filtration of CNT agglomerates that are dispersed in a solvent.

3. Coated Nanotube Arrays and Sheets a. Carbon Nanotube Polymer Coatings

Polymers to be coated can be dissolved in one or more solvents and spray or dip coated or chemically or electrochemically deposited onto the vertical CNT forests or arrays grown on a substrate, or on a sheet, as described above. The coating materials can also be spray coated in powder form onto the top of vertical CNT forests or arrays grown on a substrate, or on CNT sheets as described above. The coatings includes polymers or molecules that bond to CNTs through van der Waals bonds, π-π stacking, mechanical wrapping and/or covalent bonds and bond to metal, metal oxide, or semiconductor material surfaces through van der Waals bonds, π-π stacking, and/or covalent bonds.

For spray or dip coating, coating solutions can be prepared by sonicating or stirring the coating materials for a suitable amount of time in an appropriate solvent. The solvent is typically an organic solvent or solvent and should be a solvent that is easily removed, for example by evaporation at room temperature or elevated temperature. Suitable solvents include, but are not limited to, chloroform, xylenes, hexanes, pyridine, tetrahydrofuran, ethyl acetate, and combinations thereof. The polymer can also be spray coated in dry form using powders with micron scale particle sizes, i.e., particles with diameters less than about 100, 50, 40, 20, 10 micrometers. In this embodiment, the polymer powder would need to be soaked with solvent or heated into a liquid melt to spread the powder particles into a more continuous coating after they are spray deposited.

The thickness of the coatings is generally between 1 and 1000 nm, preferably between 1 and 500 nm, more preferably between 1 and 100 nm, most preferably between 1 and 50 nm. In some embodiments, the coating thickness is less than 500, 450, 400, 350, 300, 250, 200, 150, 100, 90, 80, 70, 60, 50, 40, 30, 20 or 10 nm.

Spray coating process restricts the deposition of coating to the CNT tips and limits clumping due to capillary forces associated with the drying of the solvent. The amount of coating visible on the CNT arrays increases with the number of sprays. Alternative techniques can be used to spray coat the coating materials onto the CNT arrays including techniques more suitable for coating on a commercial scale.

In another embodiment that demonstrates a coating process, CNT sheets are dipped into coating solutions or melted coatings to coat CNTs throughout the thickness of the sheets, increasing the thermal conductivity of the sheet in the cross-plane direction by greater than 20, 30, 50, or 70%.

In other embodiments, the coating material can be deposited on the CNT array or sheet using deposition techniques known in the art, such as chemical deposition (e.g., chemical vapor deposition (CVD)), aerosol spray deposition, and electrochemical deposition.

In one embodiment, a polymer coating can be applied by electrochemical deposition. In electrochemical deposition, the monomer of the polymer is dissolved in electrolyte and the CNT array or sheet is used as the working electrode, which is opposite the counter electrode. A potential is applied between the working and counter electrode with respect to a third reference electrode. The monomer is electrooxidized on the CNT array tips or sheet sidewalls that face the electrolyte as a result of the applied potential. Controlling the total time in which the potential is applied controls the thickness of the deposited polymer layer.

In some embodiments, the coating material is, or contains, one or more oligomeric and/or polymeric materials. In particular embodiments, the polymer can be a conjugated polymer, including aromatic and non-aromatic conjugated polymers. Suitable classes of conjugated polymers include polyaromatic and polyheteroaromatics including, but not limited to, polythiophenes (including alkyl-substituted polythiophenes), polystyrenes, polypyrroles, polyacetylenes, polyanilines, polyfluorenes, polyphenylenes, polypyrenes, polyazulenes, polynaphthalenes, polycarbazoles, polyindoles, polyazepines, poly(3,4-ethylenedioxythiophenes), poly(p-phenyl sulfides), and poly(p-phenylene vinylene). Suitable non-aromatic polymers include, but are not limited to, polyacetylenes and polydiacetylenes. The polymer classes listed above include substituted polymers, wherein the polymer backbone is substituted with one or more functional groups, such as alkyl groups. In some embodiments, the polymer is polystyrene (PS). In other embodiments, the polymer is poly(3-hexythiophene) (P3HT).

In other embodiments, the polymer is a non-conjugated polymer. Suitable non-conjugated include, but are not limited to, polyvinyl alcohols (PVA), poly(methyl methacrylates) (PMMA), polysiloxanes, polyurethanes, polydimethylsiloxanes (PDMS), and combinations (blends) thereof.

In other embodiments, the polymer is a paraffin wax. In other embodiments, the polymer is a synthetic wax such as Fischer-Tropsch waxes or polyethylene waxes. In other embodiments, the polymer is a wax that has a melting temperature above 80, 90, 100, 110, and 120° C., preferably above 130° C.

In some other embodiments, the polymer is an adhesive, such as, but not limited to, a hot glue or hot melt adhesive that combines wax, tackifiers and a polymer base to provide improved surface adhesion. In some embodiments, the adhesive is a pressure sensitive adhesive. In certain other embodiments the adhesive is a monomer that polymerizes upon contact with air or water such as a cyanoacrylate. In yet other embodiments, the adhesive is a combination of a pressure sensitive adhesive polymer and a thermally activated (or activatable) adhesive polymer which enhances ease of adhesion of a multilayered or multitiered structure described herein which includes such a combination of coatings to a surface(s), by way of the pressure sensitive adhesive and additional and more permanent or semi-permanent adhesion by way of the thermal adhesive.

b. Metallic Nanoparticles

The CNT arrays or sheets can be coated with one or more metal nanoparticles. One or more metal nanoparticles may be adsorbed to the distal ends and/or sidewalls of the CNTs to bond the distal ends of the CNTs to a surface. Metal nanoparticles can be applied to CNT arrays or sheets using a variety of methods known in the art. For example, a solution of metal thiolate such as palladium hexadecanethiolate can be sprayed or spin coated onto the distal ends and/or sidewalls of the CNTs, and the organics can be baked off to leave palladium nanoparticles. In another example, electron-beam or sputter deposition can be used to coat metal nanoparticles or connected "film-like" assemblies of nanoparticles onto the distal ends and/or sidewalls of the CNTs. The metallic particles can be coated simultaneously with the coating or before or after coating.

Examples of suitable metal nanoparticles include palladium, gold, silver, titanium, iron, nickel, copper, aluminum, and combinations thereof.

c. Flowable or Phase Change Materials

In certain embodiments, flowable or phase change materials can be applied to the CNT array or sheet. Flowable or phase change materials may be added to the CNT array or sheet to displace the air between CNTs and improve contact between the distal ends of CNTs and a surface. Flowable or phase change materials can be applied to CNT arrays or sheets using a variety of methods known in the art. For example, flowable or phase change materials in their liquid state can be wicked into a CNT array or sheet by placing the array or sheet in partial or full contact with the liquid.

Examples of suitable flowable or phase change materials include paraffin waxes, polyethylene waxes, hydrocarbon-based waxes in general, and blends thereof. Other examples of suitable flowable or phase change materials that are neither wax nor polymeric include liquid metals, oils, organic-inorganic and inorganic-inorganic eutectics, and blends thereof. In some embodiments, the coating material(s) and the flowable or phase change material are the same.

The coatings, metallic particles, and/or flow or phase change materials described above can be applied directly to the CNT arrays or sheets and the coated CNT arrays or sheets can subsequently be stacked to form multilayered or multitiered structures. In certain other embodiments, the coatings, metallic particles, and/or flow or phase change materials described above are applied during the stacking of two or more CNT arrays or sheets. In still other embodiments, the coatings, metallic particles, and/or flow or phase change materials described above are applied following the stacking of two or more CNT arrays or sheets. In non-limiting embodiments, multilayered or multitiered structure(s) are formed by first stacking two or more CNT arrays or sheets and then the at least partially interdigitated tiers of the formed structures are infiltrated with one or more coatings, metallic particles, and/or flow or phase change materials, or combinations thereof. The introduction of such coatings/materials into the at least partially interdigitated tiers of the multilayered or multitiered structure(s) prior to, during, or after stacking can be used to modify and/or enhance the electrical transport or electrical resistance properties of the multilayered or multitiered structures resulting from the stacking of the CNT arrays or sheets.

B. Multilayered or Multitiered Carbon Nanotube Structure-Based Coatings

In some embodiments described herein, multilayered or multitiered structures formed by stacking of CNT arrays or sheets described above and formed by a method including the steps of:

(1) providing at least two or more CNT arrays or sheets; and (2) stacking the at least two CNT arrays or sheets wherein the stacking results in at least partial interdigitation of the nanostructures, CNTs, of the arrays or sheets. In some embodiments, the method of making the multilayered or multitiered structures further includes a step of applying or infiltrating a coating, a coating of metallic nanoparticles, and/or a coating of flowable or phase change materials, which are described above. In some embodiments, the step of applying or infiltrating a coating, a coating of metallic nanoparticles, and/or a coating of flowable or phase change materials occurs prior to stacking, alternatively during stacking, or alternatively after stacking. In yet other embodiments, the method includes applying pressure during the stacking step. The applied pressure may be in the range of about 1-100 psi, 1-50 psi, 1-30 psi, more preferably about 1-20 psi, and most preferably about 1-15 psi. In some embodiments, the pressure is about 15 psi. Pressure may be applied continuously until the adjacent tiers are bonded, if a coating material(s) which can act as a bonding agent, such as an adhesive or phase change material, is used. Pressure may be applied for any suitable amount of time. In some embodiments, only a short time is used, such as less than 1 minute, if no bonding agent is used.

At least two CNT arrays or sheets can be stacked to form the multilayered or multitiered structures. For example, FIG. 4 shows stacking of three CNT arrays (right side). By using more CNT arrays the thickness of the multilayered or multitiered structures can be increased as needed. In some embodiments, up to 5, 10, 15, 20, 25, 30, or more CNT arrays or sheets can be stacked according to the method described above. The thickness of the resulting multilayered or multitiered structures formed by stacking can be in the range 1-10,000 microns or more.

In certain embodiments, the multilayered or multitiered structures can be formed by stacking multiple tiers of CNT arrays in a stepped manner, off-set manner, and/or other non-uniform manner in order to be able to conform to complex surfaces.

In a non-limiting embodiment, at least two vertically aligned arrays or sheets formed on supports/substrates are stacked/contacted such that the nanostructure elements, such as CNTs, of the arrays at least partially interdigitate on contact. In one embodiment full interdigitation of nanostructure elements of the arrays occurs within one another when stacked. In other embodiments the arrays may interdigitate only at the tips of the nanostructure elements, such as CNTs. In yet other embodiments, the individual nanostructures can navigate through the nanostructures of the adjacent array during the interdigitating process.

In some embodiments the nanostructures of the stacked arrays, which interdigitate at least partially, may also form into larger superstructures, such as, but not limited to, tube bundles, clumps, or rows. These superstructures may be formed through mechanisms such as capillary clumping or by way of application of a polymer coating prior to, during, or following the stacking process.

In some embodiments, a polymer coating and/or adhesive, or other coating as described above, is applied to the CNT array(s) which are then stacked. In such embodiments, the thickness of the coating and/or adhesive, or other coating as described above, is about 1-1000 nm, more preferable 1-500 nm, and most preferably 1-100 nm.

In certain embodiments of the above method, following the stacking step the method further includes a step of applying an adhesive, such as but not limited to a hot glue or hot melt adhesive that combines wax, tackifiers and a polymer base to the resulting stack to provide improved adhesion properties to one or more surfaces of the stacked/tiered CNT arrays forming the multilayered or multitiered structure. In some embodiments, the adhesive is a pressure sensitive adhesive. In yet other embodiments, the adhesive is a combination of a pressure sensitive adhesive polymer and a thermally activated (or activatable) adhesive polymer which enhances ease of adhesion of a multilayered or multitiered structure described herein which includes such a combination of coatings to a surface(s), by way of the pressure sensitive adhesive and additional and more permanent or semi-permanent adhesion by way of the thermal adhesive.

C. Coatings

The coatings prepared according to the methods described above may be single tiered or single layered structure coatings or multitiered or multilayered structure coatings. The coatings may be adhesive as noted above. The coatings need not be adhesive but may include a further step of applying one or more additional layers thereon, such as an adhesive layer, as described above.

The coatings may be formed as sheets, tapes, rolls, of any shape or size suited for application to an electrical connector. In some instances, the coatings form an O-ring shape suitable to cover the hole(s) of a lug-type electrical connector (see FIGS. 1 and 2) but any shape can be made to suit other known types of electrical connectors. In some instances sheets, tapes, or rolls of the coating are manufactured and the desired shape of the coating can be cut out or punched out of the sheets, tapes, or rolls. The coating can have any suitable thickness. In some instances, the coating thickness is in the range of between about 70 to 2000 microns or between about 70 to 1000 microns.

V. Coated Electrical Connector Applications

The electrical connectors described herein include a single layered or single tiered or a multilayered or multitiered carbon nanotube-based coating thereon.

Accordingly, such coated electrical connectors are well suited for interfacing electrical connections. The coated electrical connectors are suitable for industrial and residential applications. The coated electrical connectors described can be used in the manufacture of electrical systems for homes and building, personal computers and components thereof, server computers and components thereof, memory modules, graphics chips, radar and radio-frequency (RF) devices, disc drives, displays, including light-emitting diode (LED) displays, lighting systems, pipes, automotive control units, power-electronics, solar cells, batteries, communications equipment, such as cellular phones, thermoelectric generators, imaging equipment including MRIs, power transmission, aircraft terminals, and undersea data and power transmission.

The coatings present on the electrical connectors can provide increased conductivity and electrical resistances in the milliohm range. The coatings described can also impart hydrophobicity or superhydrophobicity to the portions of the electrical connectors which are coated. The coatings also serve to eliminate thermal expansion issues at interfaces between the coated part of the electrical connector in contact with other electrical parts or components. The use of coatings can reduce, eliminate, or relax interface stresses experienced during use of the coated electrical connectors when interfaced with other electrical parts or components.

Unless defined otherwise, all technical and scientific terms used herein have the same meanings as commonly understood by one of skill in the art to which the disclosed invention belongs. Publications cited herein and the materials for which they are cited are specifically incorporated by reference.

Those skilled in the art will recognize, or be able to ascertain using no more than routine experimentation, many equivalents to the specific embodiments of the invention described herein. Such equivalents are intended to be encompassed by the following claims.

We claim:

1. A coated electrical connector comprising:
a first connection section;
a second connection section connected to the first connection section;
wherein at least a portion of the first and/or the second connection sections is coated with a coating; and
wherein the coating comprises at least a first and a second layer or tier each layer or tier independently comprising a carbon nanotube array, wherein the carbon nanotube arrays are each present on a support formed of a metal, and
wherein the carbon nanotubes of the array of the first layer or tier at least partially interdigitate the carbon nanotubes of the array of the second layer or tier to form a multilayered or multitiered structure.

2. The coated electrical connector of claim 1, wherein the first connection section comprises a tube section which can receive a cable or electrical wire.

3. The coated electrical connector of claim 1, wherein the first connection section comprises a crimp or crimpable portion, wherein the crimp or crimpable portion can be crimped to hold a cable or electrical wire.

4. The coated electrical connector of claim 1, wherein the first or the second connection sections are selected from the group consisting of lugs, forks, tubes, crimp/crimpables, blades, butts, plugs and sockets, twist ons, screws, and amphenol type connectors.

5. The coated electrical connector of claim 1, wherein the second connection section comprises a lug portion, wherein the lug portion comprises at least one hole.

6. The coated electrical connector of claim 5, wherein the lug portion has two holes.

7. The coated electrical connector of claim 5, wherein the portion of the lug portion coated is the hole either on one surface or both top and bottom surfaces of the hole on the lug portion.

8. The coated electrical connector of claim 1, further comprising a coating material on at least some of the interstitial space between the carbon nanotubes of each of the carbon nanotube arrays.

9. The coated electrical connector of claim 1, further comprising three, four, or five additional layers or tiers as part of the multilayered or multitiered structure.

10. The coated electrical connector of claim 1, wherein the coating is adhesive or comprises an adhesive.

11. The coated electrical connector of claim 10, wherein the adhesive is a pressure sensitive adhesive.

12. The coated electrical connector of claim 10, wherein the adhesive comprises a combination of a pressure sensitive adhesive and a thermally activatable adhesive.

13. The coated electrical connector of claim 1, wherein the coating is removable.

14. The coated electrical connector of claim 1, wherein the coating conforms to flat, non-flat, undulating, or other uniform or non-uniform surface shapes of the electrical connector where the coating is present.

15. The coated electrical connector of claim 1, wherein the coating has a conductivity at least about 2 times, 3 times, 4 times, 5 times, 6 times, 7 times, 8 times, 9 times, 10 times, 11 times, 12 times, 13 times, 14 times, 15 times, 16 times, 17 times, 18 times, 19 times, 20 times, 21 times, 22 times, 23 times, 24 times, 25 times, or greater than a graphite-based gasket.

16. The coated electrical connector of claim 1, wherein the coating has an electrical resistance in the milliohm range which is less than about 1000, 900, 800, 700, 600, 500, 400, 300, 200, 100, 75, 50, 25, 20, 15, 10, 9, 8, 7, 6, 5, 4, 3, 2, 1, 0.9, 0.8, 0.7, 0.6, 0.5, 0.4, 0.3, 0.2, or 0.1 milliohms.

17. The coated electrical connector of claim 1, wherein the coating is reformable.

18. The coated electrical connector of claim 1, wherein the coating is hydrophobic and prevents moisture from entering interfaces between the coated electrical connector when in contact and/or interfaced with other electrical parts or components.

19. The coated electrical connector of claim 1, wherein the coating is superhydrophobic and prevents moisture from entering interfaces between the coated electrical connector when in contact and/or interfaced with other electrical parts or components.

20. The coated electrical connector of claim 1, wherein the coating reduces or eliminates thermal expansion issues at interfaces between the coated electrical connector when in contact and/or interfaced with other electrical parts or components.

21. The coated electrical connector of claim 1, wherein the coating reduces, eliminates, or relaxes interface stresses experienced during use of the coated electrical connectors when in contact and/or interfaced with other electrical parts or components.

22. The coated electrical connector of claim 1, wherein the coating reduces galvanic corrosion experienced during use of the coated electrical connectors when in contact and/or interfaced with other electrical parts or components made from metal and/or metals which are different from those present in the coated electrical connector.

23. The coated electrical connector of claim 1, wherein the coating removes nonconductive native oxide or oxides present on a mating surface of other electrical parts or components during the process of making the initial electrical connection between the coated electrical connector with the other electrical parts or components.

24. The coated electrical connector of claim 1, wherein the first and/or second connection sections are formed of metal and/or a metal alloy.

25. The coated electrical connector of claim 24, wherein the metal and/or metal alloy is selected from the group consisting of copper, copper alloy, aluminum, aluminum alloy, or combinations thereof.

26. The coated electrical connector of claim 24, wherein the metal and/or metal alloy is plated with tin, silver, gold chrome, nickel, nickel alloys, nickel in combination with PTFE, zinc, zinc alloys, aluminum, aluminum alloys, or combinations thereof.

27. The coated electrical connector of claim 1, wherein the coating has a thickness in a range of between about 70 to 2,000 microns.

28. A method of forming the coated electrical connector of claim 1, comprising the steps of:
  (a) providing an electrical connector;
  (b) applying a coating which comprises at least a first and a second layer or tier each independently comprising a carbon nanotube array to at least a portion of the electrical connector,
  wherein the carbon nanotube arrays are each present on a support formed of a metal, and
  wherein the carbon nanotubes of the array of the first layer or tier at least partially interdigitate the carbon nanotubes of the array of the second layer or tier to form a multilayered or multitiered structure.

29. The method of claim 28, wherein the electrical connector comprises
  a first connection section;
  a second connection section connected to the first connection section.

30. The method of claim 29, wherein the first connection section comprises a tube section which can receive a cable or electrical wire.

31. The method of claim 29, wherein the first connection section comprises a crimp or crimpable portion, wherein the crimp or crimpable portion can be crimped to hold a cable or electrical wire.

32. The method of claim 29, wherein the first or the second connection sections are selected from the group consisting of lug, fork, tube, crimp/crimpable, blade, butt, plug and socket, twist on, screw, and amphenol type connectors.

33. The method of claim 29, wherein the second connection section comprises a lug portion, wherein the lug portion comprises at least one hole.

34. The method of claim 33, wherein the lug portion has two holes.

35. The method of claim 34, wherein the portion of the lug portion coated is the hole either on one surface or both top and bottom surfaces of the hole on the lug portion.

36. The method of claim 28, further comprising a coating material on at least some of the interstitial space between the carbon nanotubes of the carbon nanotube arrays.

37. The method of claim 28, further comprising three, four, or five additional layers or tiers as part of the multilayered or multitiered structure.

38. The method of claim 28, wherein the coating is adhesive or comprises an adhesive.

39. The method of claim 38, wherein the adhesive is a pressure sensitive adhesive.

40. The method of claim 38, wherein the adhesive comprises a combination of a pressure sensitive adhesive and a thermally activatable adhesive.

41. The method of claim 28, wherein the coating is reformable.

42. The method of claim 28, wherein the coating is hydrophobic and prevents moisture from entering interfaces between the coated electrical connector when in contact and/or interfaced with other electrical parts or components.

43. The method of claim 28, wherein the coating is superhydrophobic and prevents moisture from entering interfaces between the coated electrical connector when in contact and/or interfaced with other electrical parts or components.

44. The method of claim 28, wherein the electrical connector is formed of metal and/or metal alloy.

45. The method of claim 44, wherein the metal and/or metal alloy is selected from the group consisting of copper, copper alloy, aluminum, aluminum alloy, or combinations thereof.

46. The method of claim 28, wherein the coating has a thickness in a range of between about 70 to 2,000 microns.

47. The method of claim 28, wherein the support comprises aluminum, platinum, gold, nickel, iron, tin, lead, silver, titanium, indium, copper, or combinations thereof.

48. The method of claim 28, wherein the support is a metallic foil selected from an aluminum foil or a copper foil.

49. An electronic device or component comprising the coated electrical connector of claim 1.

50. The coated electrical connector of claim 1, wherein the support comprises aluminum, platinum, gold, nickel, iron, tin, lead, silver, titanium, indium, copper, or combinations thereof.

51. The coated electrical connector of claim 1, wherein the support is a metallic foil selected from an aluminum foil or a copper foil.

* * * * *